(12) United States Patent
Lin

(10) Patent No.: US 8,089,763 B2
(45) Date of Patent: Jan. 3, 2012

(54) HEAT-DISSIPATING ASSEMBLY FOR SERVER

(75) Inventor: Te-Chang Lin, San Jose, CA (US)

(73) Assignee: Super Micro Computer Inc., CA (US)

(*) Notice: Subject to any disclaimer, the term of this patent is extended or adjusted under 35 U.S.C. 154(b) by 142 days.

(21) Appl. No.: 12/755,537

(22) Filed: Apr. 7, 2010

(65) Prior Publication Data

US 2011/0249386 A1 Oct. 13, 2011

(51) Int. Cl.
*H05K 7/20* (2006.01)

(52) U.S. Cl. ........ 361/695; 361/690; 361/694; 361/715; 454/184

(58) Field of Classification Search .................. None
See application file for complete search history.

(56) References Cited

U.S. PATENT DOCUMENTS

| | | | | |
|---|---|---|---|---|
| 6,246,580 B1 * | 6/2001 | Weng | | 361/695 |
| 6,304,443 B1 * | 10/2001 | Chou | | 361/695 |
| 6,445,586 B1 * | 9/2002 | Chou | | 361/725 |
| 6,700,778 B1 * | 3/2004 | Wang | | 361/690 |
| 7,012,804 B2 * | 3/2006 | Yokote et al. | | 361/679.33 |
| 7,254,020 B2 * | 8/2007 | Lee | | 361/695 |
| 7,382,614 B2 * | 6/2008 | Lee | | 361/695 |
| 7,567,437 B2 * | 7/2009 | Liang | | 361/695 |
| 7,589,964 B2 * | 9/2009 | Li et al. | | 361/694 |
| 7,839,638 B2 * | 11/2010 | Ye et al. | | 361/695 |

* cited by examiner

*Primary Examiner* — Boris Chervinsky

(74) *Attorney, Agent, or Firm* — Chun-Ming Shih; HDLS IPR Services

(57) ABSTRACT

A heat-dissipating assembly for a server includes a housing in which a partitioning plate and a power supply mounted on one side of the partitioning plate are provided. The power supply includes a casing and a power-supplying module received in the casing. The heat-dissipating assembly includes a fan received in the casing and located outside the power-supplying module. The partitioning plate and the casing are respectively provided with a plurality of first heat-dissipating holes and second heat-dissipating holes. The first heat-dissipating holes and the second heat-dissipating holes are positioned to correspond to the fan. The airflow caused by the fan drives the air inside the housing to flow out of the housing via the first heat-dissipating holes and the second heat-dissipating holes. In this way, the heat-dissipating efficiency can be improved without affecting the arrangement of other electronic devices in the housing.

6 Claims, 4 Drawing Sheets

HEAT-DISSIPATING ASSEMBLY FOR SERVER

BACKGROUND OF THE INVENTION

1. Field of the Invention

The present invention relates to a heat-dissipating assembly for a computer housing, and in particular to a heat-dissipating structure for a server housing.

2. Description of Prior Art

Traditionally, an industrial computer (such as a disk array system or a server system) has a housing in which a mother board, a power-supplying module or other electronic devices are provided. Further, an array of hard disks is received in the housing to provide a large amount of space for storing data.

In operation, the temperature of the above-mentioned system becomes so high that a heat-dissipating fan is often mounted on the housing in order to maintain a stable operation. The interior of the housing is provided with a partitioning plate on which the heat-dissipating fan is fixed. With the compulsive airflow caused by the fan, the heat generated inside the housing can be taken away. Further, one side of the housing is mounted with another fan. These fans generate compulsive airflow in the housing to improve the heat-dissipating efficiency inside the housing.

However, since the space inside the housing is limited, mounting a fan in the housing may reduce the space available for mounting hard disks in the housing. Thus, it is an important issue to improve the heat-dissipating efficiency without affecting the arrangement of electronic devices in the housing.

In view of the above, the present inventor proposes a novel heat-dissipating assembly based on his expert experience and delicate researches.

SUMMARY OF THE INVENTION

The present invention is to provide a heat-dissipating assembly for a server. Since the fan is positioned without affecting the arrangement of other electronic devices in the housing, the space inside the housing for mounting hard disks is not reduced.

The present invention provides a heat-dissipating assembly for a server, in which first heat-dissipating holes and second heat-dissipating holes are provided inside the housing to generate a better air convection, thereby improving the heat-dissipating efficiency.

The present invention provides a heat-dissipating assembly for a server. The server comprises a housing in which a partitioning plate and a power supply mounted on one side of the partitioning plate are provided. The power supply comprises a casing and a power-supplying module received in the casing. The heat-dissipating assembly includes a fan, a plurality of first heat-dissipating holes, and a plurality of second heat-dissipating holes. The fan is received in the casing and located outside the power-supplying module. The first heat-dissipating holes are provided on the partitioning plate and located to correspond to the fan. The second heat-dissipating holes are provided on the casing and located to correspond to the fan. The airflow generated by the fan drives the air in the housing to flow out of the housing via the first heat-dissipating holes and the second heat-dissipating holes.

In comparison with prior art, according to the present invention, the fan is provided in the power supply inside the housing. Further, the first heat-dissipating holes and the second heat-dissipating holes are respectively provided on one side of the casing of the power-supplying module and the partitioning plate inside the housing to correspond to the fan. With this arrangement, the airflow generated by the fan can drive the air inside the housing to flow out of the housing via the first heat-dissipating holes and the second heat-dissipating holes. Thus, the fan is positioned without affecting the arrangement of other electronic devices inside the housing. Further, the first heat-dissipating holes and the second heat-dissipating holes are provided inside the housing to provide a better air convection. Therefore, the heat-dissipating efficiency and in turn the practicability of the present invention can be improved greatly.

DETAILED DESCRIPTION OF THE INVENTION

The detailed description and technical contents of the present invention will be described in more detail with reference to the accompanying drawings. However, it should be noted that the drawings are illustrative only, but not used to limit the scope of the present invention.

Figure 1:
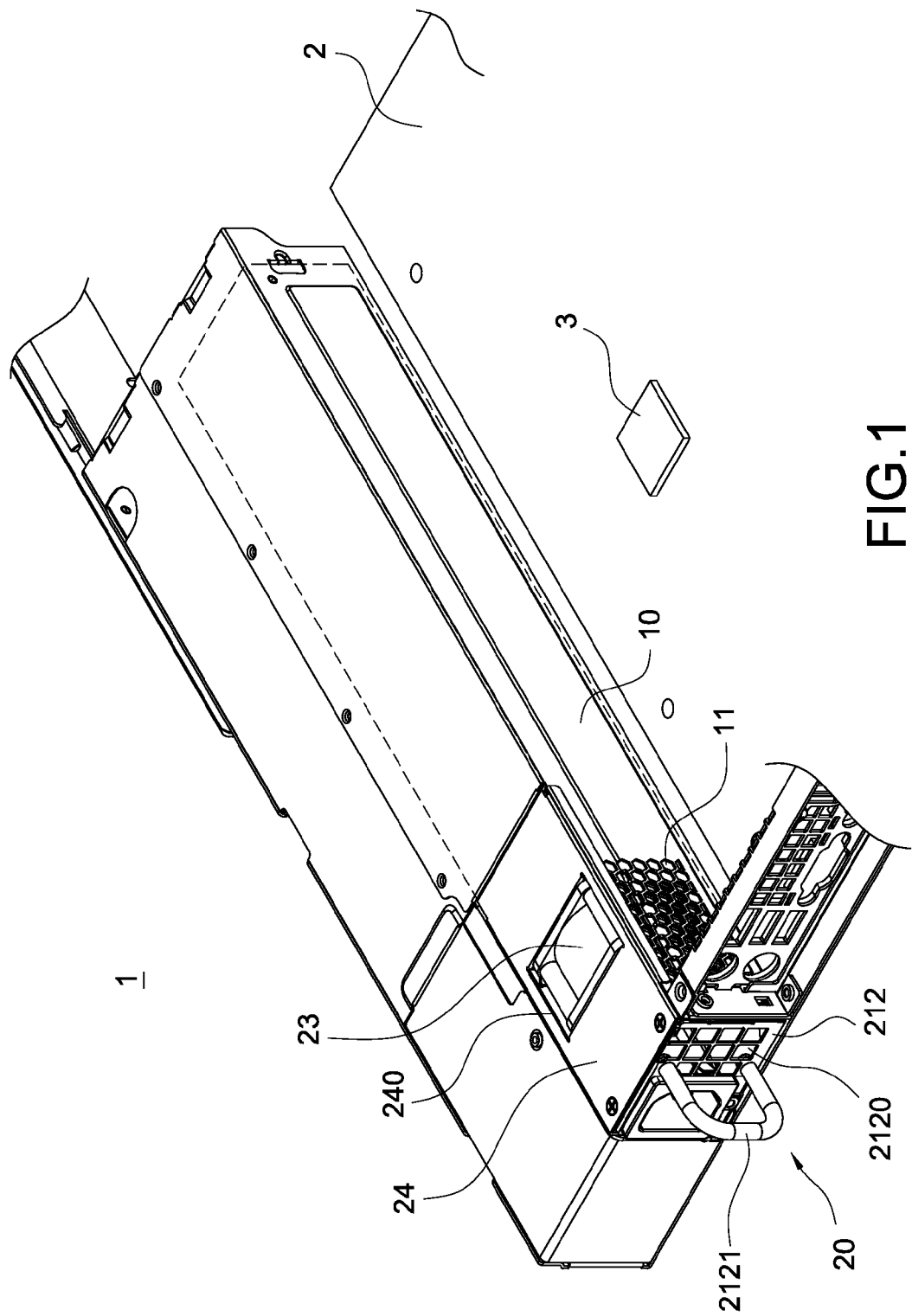
FIG. 1 is a perspective view showing the external appearance of a heat-dissipating assembly for a server according to the present invention.
Figure 2:
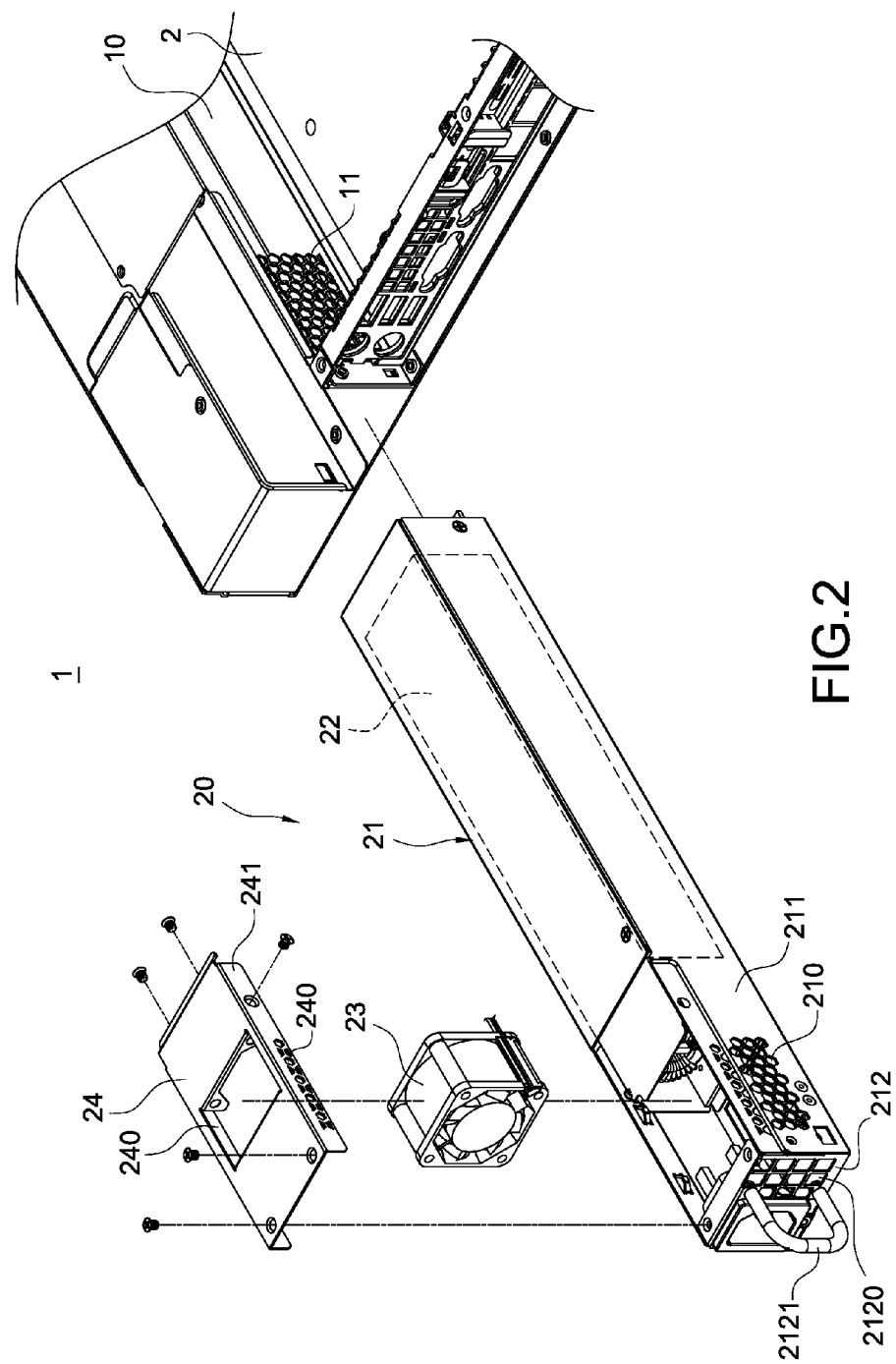
FIG. 2 is an exploded perspective view showing the heat-dissipating assembly for a server according to the present invention.
Figure 3:
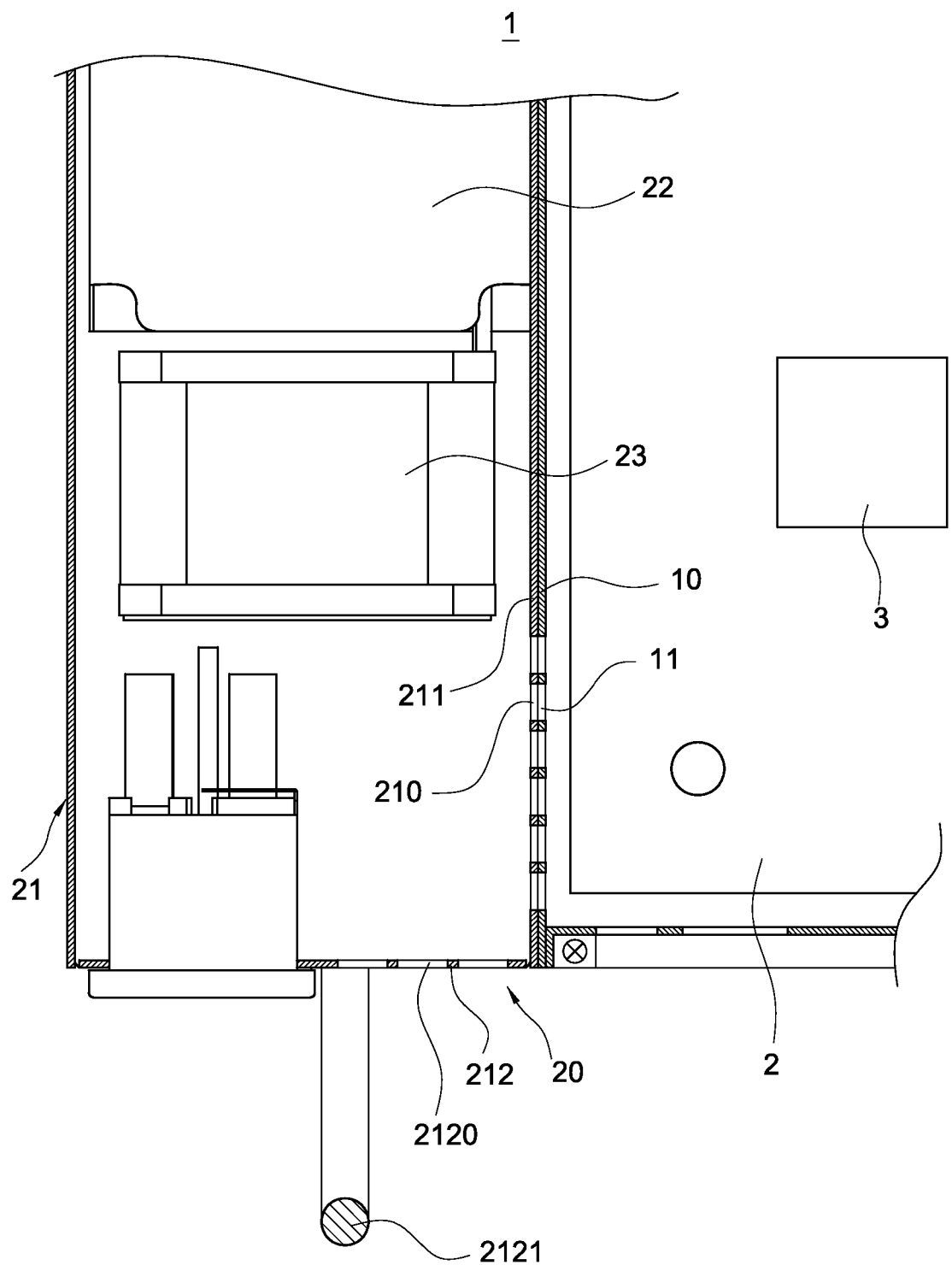
FIG. 3 is a partially cross-sectional view showing the heat-dissipating assembly for a server according to the present invention.

Please refer to FIGS. 1 to 3. FIG. 1 is a perspective view showing the external appearance of a heat-dissipating assembly for a server according to the present invention. FIG. 2 is an exploded perspective view showing the heat-dissipating assembly for a server according to the present invention. FIG. 3 is a partially cross-sectional view showing the heat-dissipating assembly for a server according to the present invention. In the present invention, the server comprises a housing 1. The interior of the housing 1 is provided with a partitioning plate 10 and a power supply 20. The power supply 20 is mounted on one side of the partitioning plate 10. The power supply 20 comprises a casing 21 and a power-supplying module 22 received in the casing 21.

The power supply 20 further comprises a fan 23. The fan 23 is provided inside the casing 21 and located outside the power-supplying module 22. One side plate 211 of the casing 21 abuts the partitioning plate 10. The side plate 211 and the partitioning plate 10 are respectively provided with a plurality of first heat-dissipating holes 210 and second heat-dissipating holes 11 to correspond to the fan 23. In the present embodiment, the cross section of each of the first heat-dissipating holes 210 and the second heat-dissipating holes 11 is shaped as a honeycomb. In practice, the cross section of each of these heat-dissipating holes 210 and 11 may be formed into a circular shape. The casing 21 further comprises a cover plate 24 for covering the fan 23. The cover plate 24 is provided with an open hole 240 at a position corresponding to that of the fan 23. The cover plate 24 is bent vertically to form a fold 241 that abuts the surface of the casing 21 and is provided with a plurality of heat-dissipating holes 240. Further, the casing 21 has a rear plate 212 on which a plurality of air outlets 2120 and a handle 2121 are provided. The air outlets 2120 are in communication with the interior of the casing 21.

The fan 23 is mounted inside the casing 21. Then, a plurality of screws (not shown) is used to fix the cover plate 24 to the casing 21. A user holds the handle 2121 to push the power supply 20 into the housing 1 with the power supply 20 abutting one side of the partitioning plate 10. At this time, since the first heat-dissipating holes 11 on the partitioning plate 10 are positioned to correspond to the second heat-dissipating holes 210 on the side plate 211, an air channel can be formed between these heat-dissipating holes. In the present embodiment, the other side of the partitioning plate 10 is provided with a mother board 2. The mother board 2 is mounted thereon with an electronic element 3 such as a central processor. The electronic element 3 also generates heat during its operation.

Figure 4:
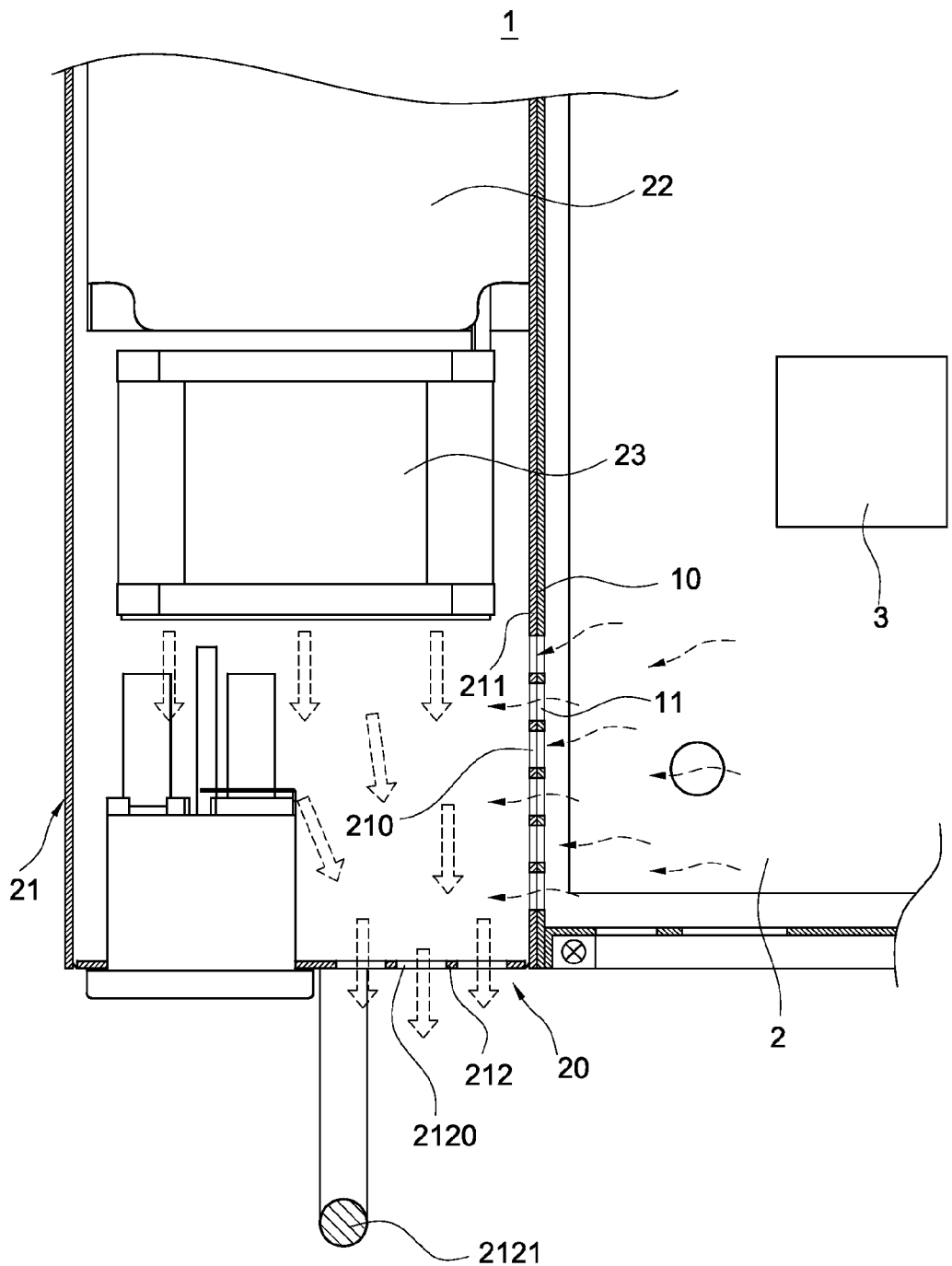
FIG. 4 is a schematic view showing an operating state of the heat-dissipating assembly for a server according to the present invention.

Please refer to FIG. 4, which is a schematic view showing the operating state of the heat-dissipating assembly for a server according to the present invention. In use, the fan 23 of the power supply 20 is activated. The compulsive airflow caused by the fan 23 can drive the hot air generated by the electronic element 3 to flow in the casing 21 via the first heat-dissipating holes 11 on the partitioning plate 10 and the second heat-dissipating holes 210 on the side plate 211. Finally, the hot air is dissipated outside the housing 1 via the air outlets 2120 of the rear plate 212 by means of the fan 23.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating assembly for a server, the server comprising a housing, the interior of the housing comprising a partitioning plate and a power supply mounted on one side of the partitioning plate, the power supply comprising a casing and a power-supplying module received in the casing, the heat-dissipating assembly including:
   a fan received in the casing and located outside the power-supplying module;
   a plurality of first heat-dissipating holes provided on the partitioning plate and located to correspond to the fan; and
   a plurality of second heat-dissipating holes provided on the casing and located to correspond to the fan;
   wherein airflow caused by the fan drives the air inside the housing to flow out of the housing via the first heat-dissipating holes and the second heat-dissipating holes.

2. The heat-dissipating assembly for server according to claim 1, wherein the casing further includes a cover plate for covering the fan, and an open hole is provided on the cover plate to correspond to the fan.

3. The heat-dissipating assembly for server according to claim 2, wherein the cover plate is bent vertically to form a fold, and the fold abuts a surface of the casing and has a plurality of heat-dissipating holes.

4. The heat-dissipating assembly for server according to claim 1, wherein the cross section of each of the first heat-dissipating holes is shaped as a honeycomb.

5. The heat-dissipating assembly for server according to claim 1, wherein the cross section of each of the second heat-dissipating holes is shaped as a honeycomb.

6. The heat-dissipating assembly for server according to claim 1, wherein the positions of the first heat-dissipating holes on the partitioning plate correspond to those of the second heat-dissipating holes on the casing.

\* \* \* \* \*